United States Patent [19]

Ichijo

[11] Patent Number: 5,245,323
[45] Date of Patent: Sep. 14, 1993

[54] DISPLAY DEVICE

[75] Inventor: Hiroshi Ichijo, Tokyo, Japan

[73] Assignee: Kabushiki Kaisha Kenwood, Tokyo, Japan

[21] Appl. No.: 944,000

[22] Filed: Sep. 11, 1992

Related U.S. Application Data

[63] Continuation of Ser. No. 693,062, May 1, 1991, abandoned, and a continuation of Ser. No. 355,864, Apr. 10, 1989, abandoned, which is a continuation of Ser. No. 21,783, Mar. 4, 1987, abandoned.

[30] Foreign Application Priority Data

| Mar. 5, 1986 [JP] | Japan | 61-46288 |
| Mar. 12, 1986 [JP] | Japan | 61-52718 |
| Mar. 18, 1986 [JP] | Japan | 61-58138 |

[51] Int. Cl.$^5$ ............................................. G09G 1/10
[52] U.S. Cl. ........................................ 345/13; 345/20; 345/185
[58] Field of Search ............... 340/720, 721, 723, 731, 340/732, 734, 736, 739, 742, 744, 745, 747, 748, 750, 789, 791, 793, 798, 799, 802, 803

[56] References Cited

U.S. PATENT DOCUMENTS

| 3,872,461 | 3/1975 | Jarosik et al. | 340/736 |
| 3,976,991 | 8/1976 | Hickin et al. | 340/742 |
| 4,165,506 | 8/1979 | Brands et al. | 340/744 |
| 4,241,340 | 12/1980 | Raney, Jr. | 340/750 |
| 4,251,815 | 2/1981 | Dagostino | 340/799 |
| 4,484,187 | 11/1984 | Brown et al. | 340/721 |
| 4,510,571 | 4/1985 | Dagostino et al. | 340/723 |
| 4,559,535 | 12/1985 | Watkins et al. | 340/793 |
| 4,634,970 | 1/1987 | Payne et al. | 340/799 |
| 4,639,721 | 1/1987 | Eto et al. | 340/799 |
| 4,647,922 | 3/1987 | Saxe | 340/747 |
| 4,684,935 | 8/1987 | Fujisaku et al. | 340/745 |

OTHER PUBLICATIONS

UM Laid-Open Gazette No. 60-13587, published Jan. 29, 1985 "Character Display Circuit for Oscilloscope" by M. Izawa/UM Application No. 58-105743 filed Jul. 7, 1983, Kikusu Electronic Industry Inc.
Nikkei Electronics 1984 12.3 pp. 145-159 "Universal Type Oscilloscope with High Operability and Digital Storage Function".

*Primary Examiner*—Richard Hjerpe
*Attorney, Agent, or Firm*—Sixbey Friedman Leedom & Ferguson

[57] ABSTRACT

A graphic image is displayed on a CRT screen according to the coordinate data which is sequentially read out of a memory. The memory comprises a first storage area which stores character image coordinate data and a second storage area which stores graphic image data such as signal wave. The ratio of addressing times for the first and second storage areas of the memory is set to 1:n. Accordingly, the graphic image is irradiated on the CRT screen n times more than that of one character image. Since the irradiation period of time of each spot is defined by a clock pulse width, there is no irradiation variation from one spot to another spot.

4 Claims, 4 Drawing Sheets

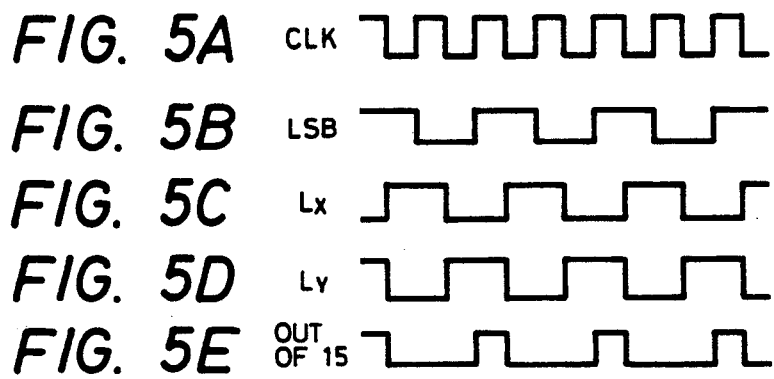
FIG. 5A CLK
FIG. 5B LSB
FIG. 5C Lx
FIG. 5D Ly
FIG. 5E OUT OF 15
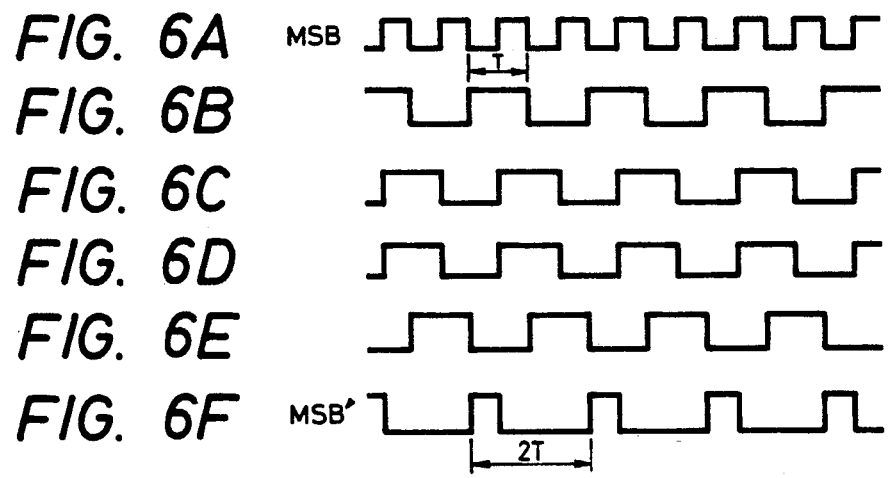
FIG. 6A MSB
FIG. 6B
FIG. 6C
FIG. 6D
FIG. 6E
FIG. 6F MSB'
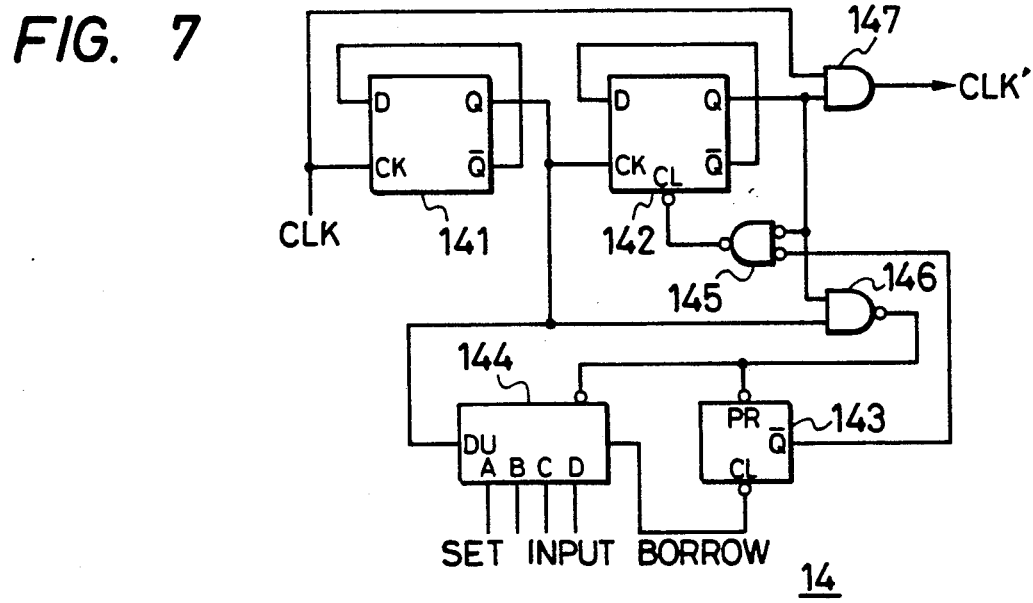
FIG. 7

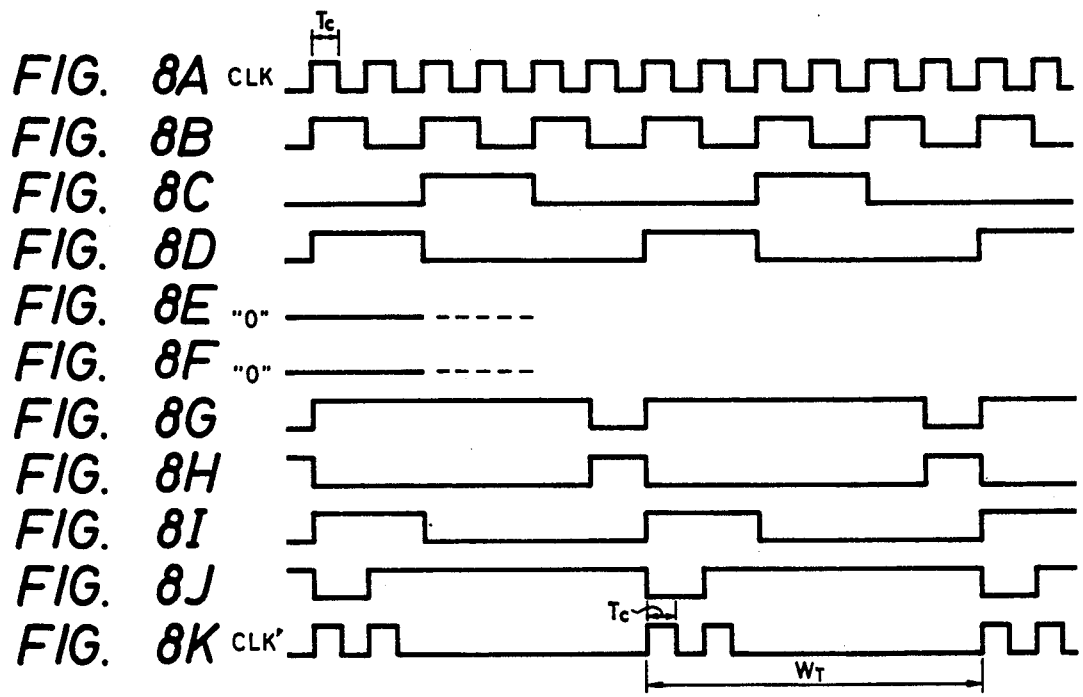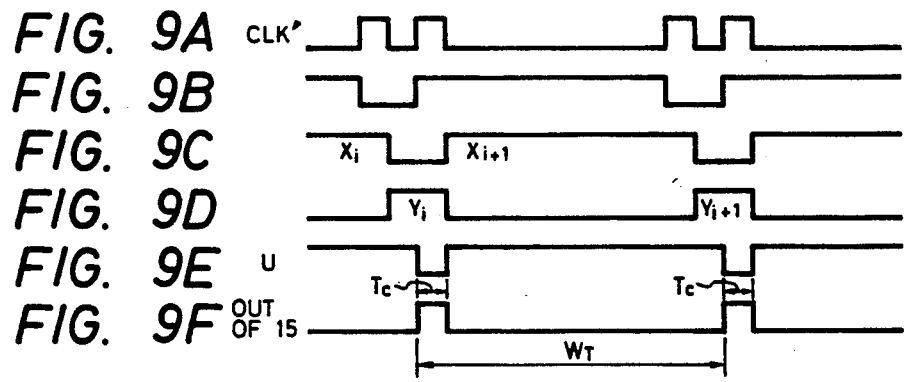

DISPLAY DEVICE

This application is a Continuation of Ser. No. 07/693,062, filed May 1, 1991, now abandoned, and a continuation of Ser. No. 07/355,864, filed Apr. 10, 1989, now abandoned, which was a continuation of Ser. No. 07/021,783, filed Mar. 4, 1987, now abandoned.

BACKGROUND OF THE INVENTION

1. Field of the Invention

The present invention relates to a display device for displaying characters, waveforms, or the like by sequentially irradiating on a cathode ray tube (CRT) a display point corresponding to data which has previously been stored and, more particularly, to a display device drive circuit of a read-out oscilloscope.

2. Related Background Art

Hitherto, there has been used a method whereby two D/A converters are used and one display point is designated and displayed on the CRT. However, in this case, a digital memory or the like is used and the scale of the outer frame of the cursor is displayed so as to overlap the main waveform to be mainly observed, or the limit value or the like of this waveform is displayed together with the main waveform. In such a case, when the brightnesses of the main waveform and of the other display data are the same, there is a problem such that the main waveform to be inherently observed is hard to be discriminated.

There has conventionally been used another method whereby two D/A converters are used and one display point is designated and displayed on the CRT. However, this display method has such a problem that it is not always easy to move or enlarge the characters, waveforms, or the like which are constituted by a set of those display points.

In the case of displaying two sets of ordinary signal waveforms and characters or the like other than the ordinary signal waveforms (the characters or the like other than the ordinary signal waveforms include the data or the like which is obtained by digitizing characters, symbols, scales, and waveforms in this specification), their luminances are independently set, respectively. In this case, the ordinary signal waveforms are expressed as an analog signal, while the characters or the like other than the ordinary signal waveforms are expressed as a digital signal. However, their luminances are set by the analog levels, respectively.

For example, analog circuit of two systems are provided and their analog levels are preset, and these circuits are switched in accordance with the timing at which each of the ordinary signal waveforms and the characters or the like other than the ordinary signal waveforms is displayed.

However, the foregoing conventional switching method has the following problems. Namely, it is difficult to set the analog level because the output timings of display points to display characters or the like are irregular. The period of time to display characters or the like is short and the luminances are switched. Thus, a variation in luminances occurs or the display characters or the like are stained due to the spike signal or the like.

SUMMARY OF THE INVENTION

It is an object of the present invention to provide a display device which can solve the foregoing problems.

According to a display device in one aspect of the invention, in a display device drive circuit in which display point data corresponding to display points are previously stored into memory means, the display point data is sequentially read out of the memory means, the read-out display point data is D/A converted, the D/A converted output is supplied as a deflection signal to an electrostatic deflection CRT and the display points are specified and thereby to sequentially irradiate the specified display points, this circuit is characterized in that the memory means is divided into a first memory section which stores display point data for the main display and a second memory which stores display point data for the auxiliary display, and display changeover means for setting the number of address designation times of the first memory section to a value which is a plurality of times larger than that of the second memory section is provided.

According to the invention with the foregoing constitution, the memory means consists of the first memory section which stores the display point data for the main display (e.g., display of waveforms) and the second memory section which stores the display point data for the auxiliary display (e.g., display for scale), and the number of address designation times of the first memory section is set to a value which is a plurality of times larger than that of the second memory section by the display changeover means.

Therefore, for the period of time when the display point data stored in the first memory section is read out a plurality of times, the display point data stored in the second memory section is read out once.

Thus, the main display image, e.g., waveform display image is thickly displayed and the auxiliary display image, e.g., scale display image is thinly displayed. Therefore, it is prevented that it is difficult to discriminate the main display image.

A display device according to the second aspect of the invention comprises: memory means which previously stores position data of each of display points which form display images other than the ordinary signal waveform; read-out means for reading out the position data from the memory means; interval setting means which can set and change a read-out time interval of the position data by the read-out means; and D/A converting means for converting the read-out position data into the analog signal and supplying the D/A converted analog signal as a deflection signal to the CRT, wherein the luminance is set by illuminating the display point which was designated by the D/A converting means.

According to the invention with the foregoing constitution, the position data is read out of the memory means at the time interval which was set by the interval setting means. The read-out position data is converted into the analog signal by the D/A converting means and the D/A converted analog signal is supplied as a deflection signal to the oscilloscope. Therefore, the display point is designated and the designated display point is illuminated. Thus, the time interval at which the display points are illuminated is set by the interval setting means. By reducing or extending this time interval, the after image changes and the luminance intensity is substantially set in correspondence to the time interval.

BRIEF DESCRIPTION OF THE DRAWINGS

FIGS. 5A to 5E are diagrams showing signal waveforms in the circuit in FIG. 1;

FIGS. 6A to 6F are diagrams showing signal waveforms when the MSB is modified to the MSB' by a display changeover circuit 7;

FIG. 7 is a circuit diagram of an interval setting circuit which can be added to the circuit in FIG. 1;

FIGS. 8A to 8K are diagrams showing signal waveforms in an interval setting circuit in FIG. 7; and FIGS. 9A to 9F are diagrams showing signal waveforms in a display device drive circuit in FIG. 1 in the case where the interval setting circuit in FIG. 7 was added.

DESCRIPTION OF THE PREFERRED EMBODIMENTS

Figure 1:
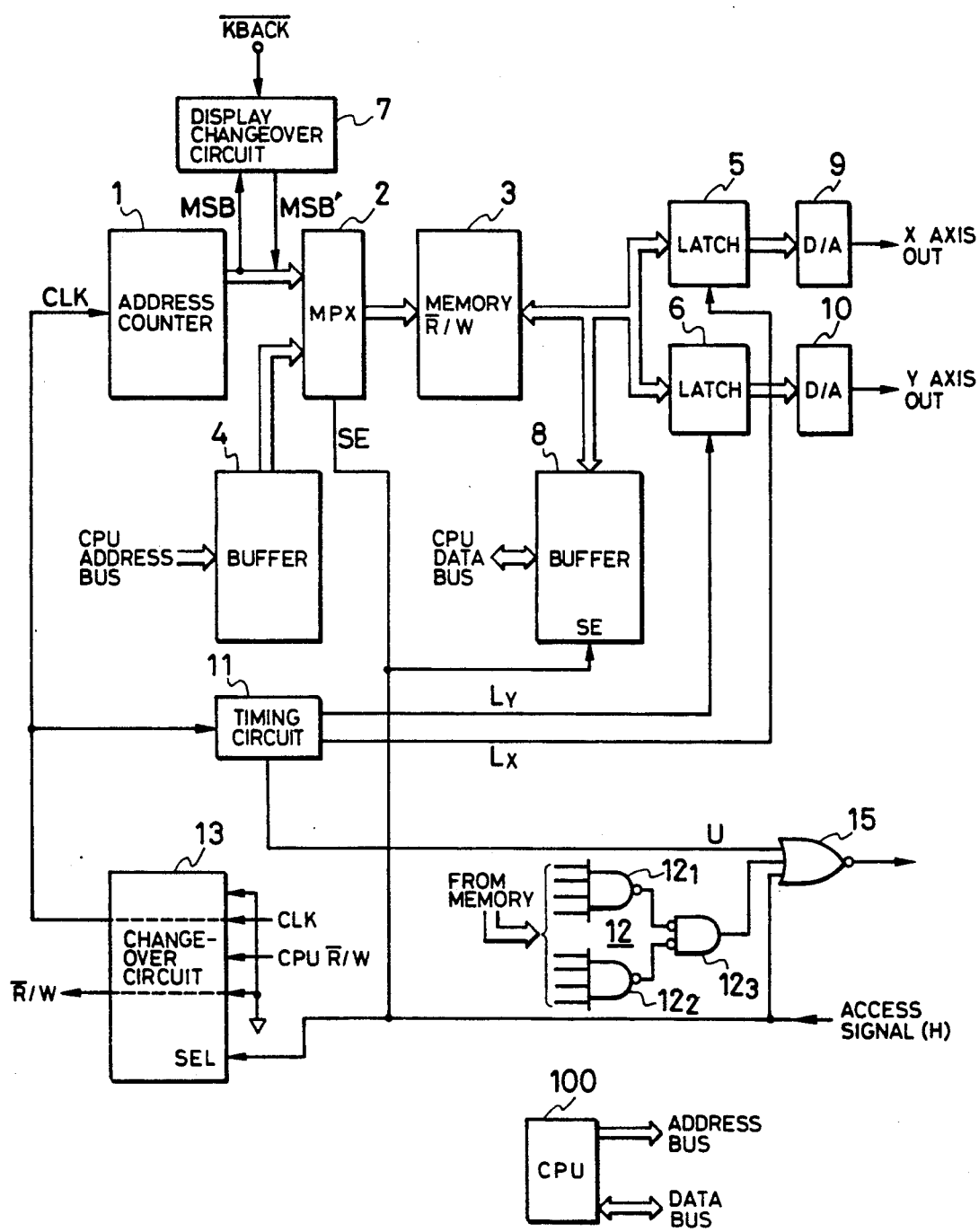
FIG. 1 is a circuit diagram of an embodiment of a display device drive circuit according to the present invention.

FIG. 1 is a block diagram showing an embodiment of the present invention.

In a constitution of FIG. 1, the schematic operation will be first described. Character data and waveform data to be displayed on a CRT are previously stored in a memory 3. For example, digital data $X_i$ and $Y_i$ to designate the display position coordinates on the CRT display at the location of address i in the memory 3 constitute one pair. The data $X_i$ and $Y_i$ which were read out of the address i at a certain time are transmitted through latches 5 and 6 and respectively converted by D/A converters 9 and 10 into the voltages to deflect a CRT beam with respect to the X and Y axes of the CRT. The beam position, i.e., the display position on the CRT display screen is determined on the basis of the converted voltages. On the other hand, the power of beam is modulated by the output of a NOR gate 15, thereby illuminating the positioned coordinates at predetermined timings for a predetermined period of time. By sequentially reading out the data from the memory 3, the characters or waveforms according to the data are displayed on the CRT display screen.

When data is read out of the memory 3, an address which is provided for the memory 3 is generated on the basis of the output of an address counter 1. On the other hand, when data is written into the memory 3, its address is given from an address buffer 4 and the data to be written is given from a data buffer 8. A multiplexer (MPX) 2 is provided to change over the read address and write address. In this embodiment, the data to be written into the memory 3 and the address to be written into the memory 3 with respect to this data are given by a microprocessor (CPU) 100. Since the method of forming the write address and data by the CPU 100 is not directly concerned with the present invention, it is not described in detail here.

The more practical operation will now be described hereinbelow.

The address data from the address counter 1 is supplied through the multiplexer 2 to the memory 3, thereby designating the address in the memory 3. On the other hand, the address data which is obtained from the microprocessor 100 through the address buffer 4 is supplied to the multiplexer 2. The data which was read out of the memory 3 is supplied to the data latch circuits 5 and 6 and latched therein. The data which is derived from the microprocessor 100 to the memory 3 or the data which is transmitted from the memory 3 to the microprocessor 100 is supplied to the memory 3 through the tri-state data bus buffer 8, thereby enabling the memory content in the memory 3 to be written and read out by accessing from the microprocessor 100.

The data latched in the data latch circuit 5 is supplied to the D/A converter 9 and its analog output is used as a deflection signal for an X axis. The data latched in the data latch circuit 6 is supplied to the D/A converter 10 and its analog output is used as a deflection signal for a Y axis. These deflection signals for the X and Y axes are supplied to the cathode ray tube (CRT) display device.

Figure 2:
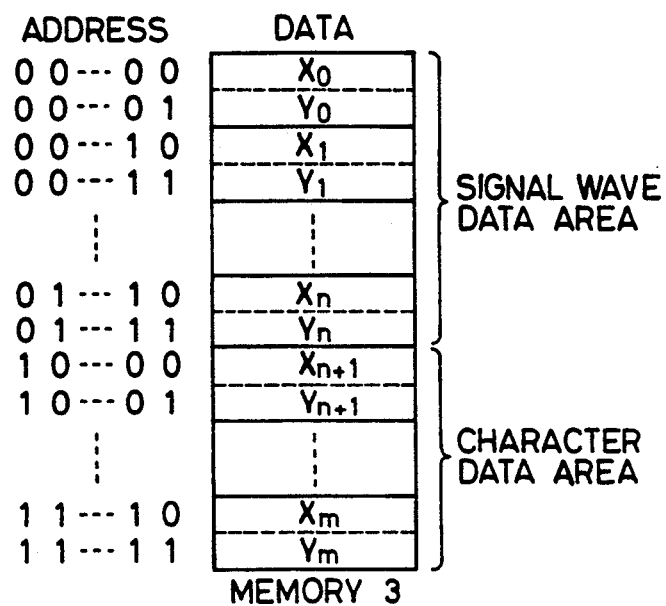
FIG. 2 is a diagram showing coordinate point data which is displayed on a CRT and which is stored into a memory in FIG. 1.

On the other hand, as shown in FIG. 2, the memory 3 is divided into two areas: namely, for example, the area of addresses of 00 ... 00 to 01 ... 11 in which signal wave data is stored and the area of addresses of 10 ... 00 to 11 ... 11 in which character data is stored. The coordinate data of the X and Y axes regarding one display point on the CRT is stored as a pair into the adjacent addresses.

Figure 3:
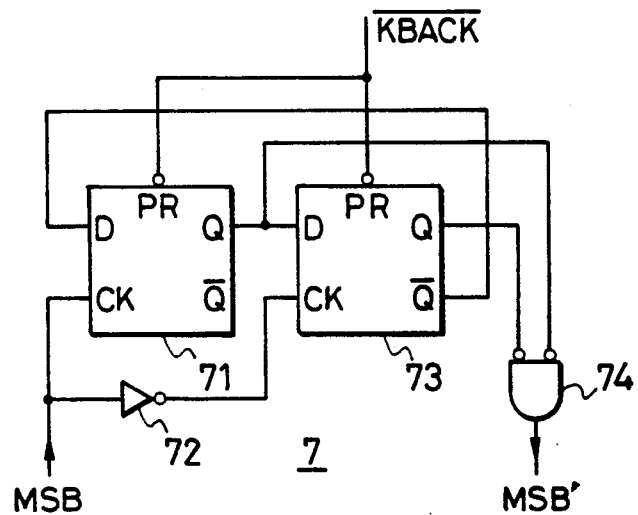
FIG. 3 is a detailed circuit diagram of a display change over circuit in FIG. 1.

Reference numeral 7 denotes a display changeover circuit which is constituted in such a manner that the ratio of the whole number of addressing times in the upper half portion of the memory 3 and the whole number of addressing times of the lower half portion shown in FIG. 2 is set to n:1 (n is an integer). When n=4, for example, the display changeover circuit 7 is constituted as shown in FIG. 3. Namely, the changeover circuit 7 comprises: a D flip-flop circuit 71 which receives, as a clock signal, the most significant bit (MSB) in the address data which is transferred from the address counter 1 to the multiplexer 2; an inverter 72 to invert the MSB; a D flip-flop circuit 73 which receives the output of the inverter 72 as a clock signal; and an AND gate 74 which receives the inverted outputs of the Q outputs of the D flip-flops 71 and 73 and which generates an output MSB' on the axis of the MSB which is supplied from the address counter 1.

Figure 4:
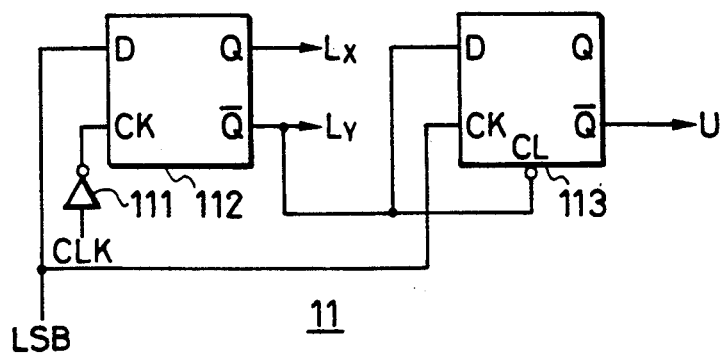
FIG. 4 is a detailed circuit diagram of a timing circuit in FIG. 1.

On the other hand, a timing signal generating circuit (hereinafter, abbreviated to a timing circuit) 11 receives a clock signal which is supplied to the address counter 1 and generates a first strobe signal $L_X$ for allowing the X axis data in the memory 3 to be latched into the data latch circuit 5 and a second strobe signal $L_Y$ for allowing the Y axis data in the memory 3 to be latched into the data latch circuit 6. After the elapse of the settling time of the D/A converter 10 subsequent to the generation of the second strobe signal $L_Y$, the timing circuit 11 outputs a signal U. When the X axis data and the Y axis data corresponding thereto are read out, the signal U is set to the high level and supplied to the NOR gate 15. As shown in an example of FIG. 4, the timing circuit 11 comprises: an inverter 111 to invert the clock signal; a D flip-flop circuit 112 which receives the data indicative of the least significant bit (LSB) in the address data which is supplied to the memory 3; and a D flip-flop circuit 113 which receives the output $\overline{Q}$ of the D flip-flop circuit 112, i.e., the second strobe signal as the data. When the X axis data and Y axis data are latched, the D flip-flop circuit 113 generates the signal U.

Numeral 13 denotes a changeover circuit to change over the supply and shut-off of the clock signal and of the read/write signal (hereinafter, referred to as the $\overline{R}$/W signal) from a microprocessor on the basis of an access signal (at a high potential) from the microprocessor. When the access is not performed, namely, when the access signal is set to a low potential, the clock signal and read signal ($\overline{R}$ signal) are selected. The clock signal which is output through the changeover circuit 13 is supplied to the address counter 1 and timing circuit 11. The $\overline{R}$/W signal which is output through the changeover circuit 13 is supplied to the microprocessor 100, memory 3, and data bus buffer 8. The writing or reading operation is performed on the basis of the $\overline{R}$/W signal. Further, when data is written into the memory 3, the access signal is supplied to the multiplexer 2, data bus buffer 8, and NOR gate 15. The multiplexer 2 selects the output signal from the buffer 4 by the access signal and sets the buffer 8 into the bilateral conducting state. At the same time, the multiplexer 2 sets the output of the NOR gate 15 to a low potential irrespective of the state of the signal U, thereby preventing data from being displayed on the CRT.

The output of the NOR gate 15 is supplied to the CRT and when it is set to a high potential, a display point is illuminated.

When no access signal is supplied, the clock signal is output from the changeover circuit 13 as shown in FIG. 5A and the $\overline{R}$/W signal is set to a low potential, so that the memory 3 is set into the read-out state. Simultaneously, the count value of the address counter 1 is selected in the multiplexer 2 and the data bus buffer 8 is set into the high impedance state.

Therefore, an address in the memory 3 is designated on the basis of the count value of the address counter 1 and the data is sequentially read out of the designated addresses in the memory 3. On the other hand, the LSB of the output of the address counter 1 is as shown in FIG. 5B. The first strobe signal $L_X$ which is generated from the timing circuit 11 is as shown in FIG. 5C. The second strobe signal $L_Y$ is as shown in FIG. 5D. Thus, the X axis data ($X_i$) which was read out of the memory 3 is latched into the data latch circuit 5 by the first strobe signal $L_X$. The Y axis data ($Y_i$) which was read out of the memory 3 is latched into the data latch circuit 6 by the second strobe signal $L_Y$. The outputs latched in the latch circuits 5 and 6 are converted into the analog signals by the A/D converters 9 and 10. The analog signals are applied to the CRT as the horizontal deflection signal and vertical deflection signal, respectively. Thus, the point ($X_i$, $Y_i$) to be illuminated is determined by the horizontal and vertical deflection signals. The output of the NOR gate 15 is set to a high potential at the timing shown in FIG. 5E on the basis of the signal U from the timing circuit 11.

Therefore, the display point at the position designated by the analog signals from the D/A converters 9 and 10 is illuminated for the period of time when the output of the NOR gate 15 is at a high potential as shown in FIG. 5E. By sequentially performing the foregoing operation, the characters and waveforms corresponding to the character data and waveform data stored in the memory 3 are displayed on the CRT.

Further, in the embodiment of the invention, the changeover circuit 7 as shown in FIG. 3 is provided. The circuit 7 receives the MSB in the count from the address counter 1 and modifies the MSB in accordance with a control signal $\overline{KBACK}$ and outputs as the MSB'.

By setting the signal $\overline{KBACK}$ to a low potential, the output of the AND gate 74 is always set to a low potential irrespective of the MSB. The address of "0zz...z" (z is 0 or 1) in the memory 3 is designated and only the data in the waveform data area is always sequentially read out and only the waveforms are displayed.

By setting the signal $\overline{KBACK}$ to a high potential, the changeover circuit 7 operates in response to the MSB data of the address counter 1. Namely, assuming that the MSB of the address counter 1 which counted the clock signal is as shown in FIG. 6A, data D of the D flip-flop circuit 71 is latched in response to the leading edge of the MSB data. Data D of the D flip-flop circuit 73 is latched in response to the trailing edge of the MSB data. The data D which is supplied to the D flip-flop circuit 71 is as shown in FIG. 6B. The output Q of the D flip-flop circuit 71 is as shown in FIG. 6C. The data D which is supplied to the D flip-flop circuit 73 is as shown in FIG. 6D. The output Q of the D flip-flop circuit 73 is as shown in FIG. 6E. Therefore, the output MSB' of the AND gate 74 has such a waveform as shown in FIG. 6F. Since FIG. 6A shows the MSB data, the bits lower than the MSB are circulated for the period of time T.

Thus, for the interval when the waveform shown in FIG. 6F is set to a high potential, the address data is "1zz...z" and the data in the character data area in the memory 3 is read out. For the interval when the waveform of FIG. 6F is set to a low potential, the address data is "0zz...z" and the data in the waveform data area in the memory 3 is read out. Therefore, the characters are displayed for the period of time of ¼ of the whole display interval. The waveforms are displayed for the period of time of ¾ of the whole display interval. Thus, the waveforms are displayed as the images which are bright three times than the characters.

When the access signal is then supplied, the clock signal is shut off by the switching operation of the changeover circuit 13. The multiplexer 2 selects the address data from the buffer 4 and the high potential state of the data bus buffer 8 is released and the bidirectionally connected state is set. Simultaneously, the output of the NOR gate 15 is set to a low potential and the display is stopped. During this interval, the content of the memory 3 can be written or read out in association with the data from the microprocessor. In this case, since the display is stopped, the display image on the CRT is not fluctuated when the display data is being written from the microprocessor.

The foregoing embodiment of the invention has been described as an example with respect to the case where the ratio of the data in the waveform data area and the data in the character data area is set to 1:1. However, this ratio is not limited to only 1:1. The display ratio of the display data areas is not necessarily limited to ¾:¼.

In addition, the case where the MSB in the address in the memory 3 is operated to thereby designate the waveform data area and character data area has been described in the foregoing embodiment. However, those areas may be also designated by operating a plurality of bits including the MSB.

With the circuit constitution of FIG. 1, when both of the main display and the auxiliary display are performed on the same CRT, the ratio in an average irradiation of the auxiliary display to the main display is set to a small value. Therefore, the auxiliary display can be also performed while making it easy to see the main display data to be inherently observed.

A characteristic data detecting circuit 12 is provided in the embodiment shown in FIG. 1. The Y axis data which was read out of the memory 3 is applied to eight-bit inputs of gates 121 and 122. When all of eight bits of the Y axis data are "1", namely, when the data is FF as a hexadecimal code, the output of a gate 123 is set to the high level and the output of the NOR gate 15 is set to the low level. Since the output of the NOR gate 15 is always set to the low level irrespective of the state of the signal from the timing circuit 11, the bright display on the CRT at the coordinates when the Y axis data is FF is not performed. In this case, the data is not necessarily limited to FF but other data may be also selected. On the other hand, the X axis data may be also used in place of the Y axis data. The data which the operator does not want to display can be arbitrarily set.

In this embodiment, by properly processing the coordinate data in the memory 3 by the CPU 100, the characters or diagrams displayed on the CRT can be moved, enlarged, or the like.

For example, by adding P to each of the X axis data in the memory 3, the characters or diagrams can be moved by only P in the direction of the X axis. On the other hand, by multiplying P to each of the X axis data, the characters or diagrams can be enlarged only P times in the direction of the X axis.

In the embodiment of FIG. 1 described above, the normal clock signal having a duty ratio of 50% shown in FIG. 6A has been used to control each circuit. In place of this clock signal, it is possible to use a clock signal CLK' as shown in FIG. 8K. The clock signal CLK' is obtained by modifying the clock signal CLK in FIG. 6A by an interval setting circuit 14 as shown in FIG. 7. By inputting the modified clock signal CLK' to the changeover circuit 13 in place of the clock signal CLK, the luminance of the display point on the CRT can be adjusted.

The clock signal CLK shown in FIG. 8A is supplied to the interval setting circuit 14. The case where "0010" is set as preset data into a presettable counter 144 will now be explained as an example. As shown in FIG. 8B, the Q output of the D flip-flop 141 becomes the signal which is obtained by dividing the clock signal into half. The presettable counter 144 counts down the output of the D flip-flop 141 shown in FIG. 8B. The outputs $Q_A$, $Q_B$, $Q_C$, and $Q_D$ of the presettable counter 144 are as shown in FIGS. 8C, 8D, 8E, and 8F, respectively. The borrow signal from the presettable counter 144 is output at a timing shown in FIG. 8G. Thus, the $\bar{Q}$ output of a D flip-flop 143 becomes as shown in FIG. 8H. The Q output of a D flip-flop 142 becomes as shown in FIG. 8I. Therefore, the output CLK' of an AND gate 147 becomes a pulse having an interval of $W_T$ between two continuous pulses and the next two continuous pulses as shown in FIG. 8K. The $X_i$ and $Y_i$ data are read out of the memory 3 by two pulses which are generated for the interval $W_T$ and one coordinate point is determined and this point is illuminated once within the period of time $W_T$. The interval $W_T$ corresponds to the preset value of the presettable counter 144 and can be reduced or extended in accordance with the preset value. FIG. 8J shows the output of a NAND gate 146, namely, the load pulse.

When no access signal is supplied, i.e., when the display operation is being performed, the output CLK' of the AND gate 147 which was produced by the interval setting circuit 14 is output as a clock signal from the changeover circuit 13 and supplied to the timing circuit 11 and address counter 1. Simultaneously, the $\overline{R/W}$ signal is set to a low potential and the memory 3 is set into the reading state. The count value of the address counter 1 is selected by the multiplexer 2 and the data bus buffer 8 is set to a high impedance state.

Therefore, an address is designated in the memory 3 by the count values of the address counter 1. The X axis data $X_i$ and Y axis data $Y_i$ are sequentially read out of the designated address in the memory 3. The clock signal CLK' which is supplied to the timing circuit 11 is the pulse shown in FIG. 9A and is the same pulse as that shown in FIG. 8K. The LSB of the output of the address counter 1 supplied with the pulse of FIG. 9A is as shown in FIG. 9B. The strobe signal $L_X$ which is generated from the timing circuit 11 is as shown in FIG. 9C and the strobe signal $L_Y$ is as shown in FIG. 9D. Thus, the X axis data $X_i$ which was read out of the memory 3 is latched into the latch circuit 5 by the strobe signal $L_X$. The Y axis data $Y_i$ which was read out of the memory 3 is latched into the latch circuit 6 by the strobe signal $L_Y$. The outputs latched in the latch circuits 5 and 6 are converted into the analog signals by the D/A converters 9 and 10, respectively. The D/A converted analog signals are applied as horizontal and vertical deflection signals to the CRT, respectively. The display point ($X_i$, $Y_i$) to be illuminated is determined by those deflection signals. On the other hand, when the X axis data $X_i$ and the Y axis data $Y_i$ corresponding thereto are latched on the basis of the signals which are generated from the timing circuit 11 as shown in FIG. 9E, the signal U is generated and the output of the NOR gate 15 is set to a high potential at a timing shown in FIG. 9F.

Therefore, the display point at the position designated by the outputs of the D/A converters 9 and 10 is illuminated for the period of time when the output of the NOR gate 15 is set to a high potential as shown in FIG. 9F. The interval between pulses when the output of the NOR gate 15 is set to a high potential is equal to $W_T$ corresponding to the preset value of the presettable counter 144. The interval $W_T$ can be digitally reduced or extended by changing the preset value. Therefore, when the interval $W_T$ is extended, the display image becomes thin due to the after image on the CRT. When the interval $W_T$ is reduced, the display image becomes thick.

Although the case where two pulses were used to designate a display point has been described above as an example, the number of pulses is not necessarily limited to two.

As shown in FIG. 9F, the interval when a beam spot is illuminated on the CRT is equal to the pulse width $T_C$ of the clock signal CLK and is constant. The pulse generation interval $W_T$ is changed. Although the interval to illuminate the beam spot is constant, when the interval $W_T$ is long, the scan time of one picture plane on the CRT becomes long. Therefore, the number of illumination times in a unit time at a certain point on the CRT is reduced, causing the luminance to be decreased. It is important to form such a signal as shown in FIG. 9F because of the following reasons. For example, in the case of using a one-shot multivibrator, the ratio of $W_T$ and $T_C$ can be easily changed. However, since the width of $T_C$ which was set by the one-shot multivibrator is not so accurate, slight difference and variation in brightness occur every coordinate point on the CRT, causing a large incovenience in terms of the visual viewpoint. On the other hand, since the signal of FIG. 9A is formed at the accurate timing of the clock signal, the width of $T_C$ is always extremely accurate, so that all of the coordinate points are illuminated with the uniform brightness.

According to the circuit constitution described above, the position data is read out of the memory means at the time interval which was set by the interval setting means and the display point corresponding to the read-out position data is illuminated. By changing the interval of the interval setting means, the luminance of the display point can be changed with the aid of the after image.

For example, when the ordinary signal waveform was displayed simultaneously with the signal waveform based on the digitized data, the luminance can be independently set.

I claim:

1. A display device drive circuit comprising:
   a memory including a first set of storage locations which stores coordinate data of a first type of image and a second set of storage locations which stores coordinate data of a second type of image;
   means for generating read-out address codes which are applied to said memory for each successive data display period, so that the ratio of the read-out times of the coordinate data from the storage locations in said memory for each data display period is m:n for the first and second sets of storage locations, where m and n are integer values which differ from each other;
   means for applying deflection signals to the display device for each data display period in response to the coordinate data read out from the storage locations in said memory according to the read-out address codes; and
   means for generating a spot irradiation signal for each coordinate data read out from said memory to apply it to the display device in synchronization with each read-out of coordinate data, the spot irradiation signal being adapted to irradiate a spot on the display for a predetermined fixed spot irradiation period for each read-out of coordinate data so that the ratio of the number of fixed spot irradiation periods of the first type of data to the number of fixed spot irradiation periods of the second type of data is m:n for each data display period whereby the ratio of the intensity of the spots corresponding to the first type of data to the intensity of the spots corresponding to the second type of data is a function of m:n for each data display period.

2. A display device drive circuit according to claim 1, wherein said address code generating means includes
   means for generating original read-out address codes capable of sequentially addressing the first and second sets of storage locations;
   means in response to the sequentially generated original read-out address codes for modifying part of each original read-out address code so that the ratio of the reading-out times of the coordinate data read out from the storage locations in said memory sequentially addressed by the modified read-out address codes is m:n for the first and second sets of storage location.

3. A display device drive circuit according to claim 2, wherein said modifying means modifies the most significant bit (MSB) signal of the original read-out address codes so that the interval ratio for "LOW" and "HIGH" in the modified MSB signal is m:n.

4. A display device drive circuit according to claim 1, wherein said spot irradiation signal generating means renders the spot irradiation period zero in response to a specific coordinate data read out from said memory.

* * * * *